United States Patent
Huang et al.

(10) Patent No.: US 6,939,664 B2
(45) Date of Patent: Sep. 6, 2005

(54) LOW-ACTIVATION ENERGY SILICON-CONTAINING RESIST SYSTEM

(75) Inventors: Wu-Song Huang, Poughkeepsie, NY (US); Robert D. Allen, San Jose, CA (US); Marie Angelopoulos, Cortlandt Manor, NY (US); Ranee W. Kwong, Wappingers Falls, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 10/693,199

(22) Filed: Oct. 24, 2003

(65) Prior Publication Data

US 2005/0089792 A1 Apr. 28, 2005

(51) Int. Cl.$^7$ ............................................. G03E 7/004
(52) U.S. Cl. .................... 430/270.1; 430/311; 430/313; 430/314
(58) Field of Search ............................. 430/270.1, 311, 430/313, 314

(56) References Cited

U.S. PATENT DOCUMENTS

| | | |
|---|---|---|
| 5,712,078 A | 1/1998 | Huang et al. |
| 5,985,524 A | 11/1999 | Allen et al. |
| 6,037,097 A | 3/2000 | Bucchignano et al. |
| 6,043,003 A | 3/2000 | Bucchignano et al. |
| 6,087,064 A | 7/2000 | Lin et al. |
| 6,225,403 B1 * | 5/2001 | Knowlton ................... 524/858 |
| 6,309,796 B1 | 10/2001 | Nakashima et al. |
| 6,420,084 B1 | 7/2002 | Angelopoulos et al. |
| 6,420,088 B1 | 7/2002 | Angelopoulos et al. |
| 6,531,260 B2 | 3/2003 | Iwasawa et al. |
| 6,623,909 B2 | 9/2003 | Hatakeyama et al. |
| 2001/0036594 A1 | 11/2001 | Kozawa et al. |
| 2001/0038967 A1 * | 11/2001 | Mizutani et al. ......... 430/270.1 |
| 2002/0058204 A1 | 5/2002 | Khojasteh et al. |
| 2002/0081520 A1 | 6/2002 | Sooriyakumaran et al. |
| 2002/0090572 A1 * | 7/2002 | Sooriyakumaran et al. ....................... 430/271.1 |
| 2003/0073040 A1 | 4/2003 | Iwasawa et al. |
| 2003/0113658 A1 | 6/2003 | Ebata et al. |

FOREIGN PATENT DOCUMENTS

| | | | | |
|---|---|---|---|---|
| EP | 0 628 876 A1 | | 5/1994 | |
| EP | 745633 A2 | * | 12/1996 | ........... C08G/77/14 |
| JP | 10324748 A | * | 12/1998 | ........... C08G/77/04 |
| JP | 11302382 A | * | 11/1999 | ........... C08G/77/04 |

OTHER PUBLICATIONS

Machine translation of JP11–302382.*
"Determination of coupled acid catalysis–diffusion processes in a positive–tone chemically amplified photoresist" Houle et al. Journal Vac. Sci. Technology B 18 (4) Jul./Aug. 2000, ppgs. 1874–1885.
"Modeling and simulations of a positive chemically amplified photoresist or ex–ray lithography", Krasnoperova et al., Journal Vac. Sci. Technology B 12 (6) Nov./Dec. 1994, ppgs. 3900–3904.
U.S. Appl. No. 10/604,082, "Process for forming features of 50 nm or less half–pitch with chemically amplified resist imaging" Medeiros et al., filed Jun. 25, 2003.
U.S. Appl. No. 10/079,289, "Substantially transparent aqueous base soluble polymer system for use in 157 nm resist applications" Sooriyakumaran et al., filed Feb. 20, 2002.

* cited by examiner

*Primary Examiner*—Amanda Walke
(74) *Attorney, Agent, or Firm*—Todd M.C. Li

(57) ABSTRACT

Inventive silsesquioxane polymers are provided, and resist compositions that contain such silsesquioxane polymers are provided in which at least a portion of the silsesquioxane polymer contains fluorinated moieties, and at least a portion of the silisesquioxane polymer contains pendant solubility inhibiting acid-labile moieties that have low activation energy for acid-catalyzed cleaving, and the presence of high optical density moieties are minimized or avoided. The inventive polymer also contains pendant polar moieties that promote alkaline solubility of the resist in aqueous alkaline solutions. The inventive polymers are particularly useful in positive resist compositions. The invention encompasses methods of using such resist compositions in forming a patterned structure on a substrate, and particularly multi-layer (e.g. bilayer) photolithographic methods, which methods are capable of producing high resolution images at wavelengths such as 193 nm and 157 nm.

20 Claims, No Drawings

LOW-ACTIVATION ENERGY SILICON-CONTAINING RESIST SYSTEM

BACKGROUND OF THE INVENTION

The need to remain cost and performance competitive in the microelectronics industry has caused continually increasing semiconductor device density in integrated circuits. To facilitate the increase in device density, new technologies are constantly needed to allow the minimum feature size of these semiconductor devices to be reduced. This requires high-resolution lithography, the principal technique used in patterning microelectronics circuitry. Over approximately the last 20 years, the industry has migrated to shorter wavelength photolithography as the primary means of scaling the resolution to sustain the progressive demand for smaller features. The wavelength of photolithography has migrated from mid-ultraviolet (MUV) wavelengths (350–450 nm) to deep-UV (DUV) radiation (190–300 nm) and vacuum UV (VUV, 125–160 nm). Likewise the photo-sensitive materials used in photolithography, resists, have evolved. MUV lithography employed diazonaphthoquinone (DNQ) and novolac-based resists. These materials offered high performance but were not extendible to DUV and VUV wavelengths due to their opacity at these shorter wavelengths. In addition, these resists were not of sufficient sensitivity to afford high throughput manufacturing.

In response to the need for new, lower opacity, higher sensitivity materials for DUV imaging, Ito et al. disclosed (U.S. Pat. No. 4,491,628) the development of chemically amplified resists (CARs) based on the photochemically-generated-acid (from a photosensitive acid generator) catalyzed deprotection of an acid-labile polymer. That is, for positive tone CARs, acid labile moieties of the polymer are cleaved by an acid-catalyzed thermolysis reaction that renders the deprotected form of the polymer soluble in a subsequently applied developer, such as an aqueous base. Thus, an image of the projected patternwise radiation is formed in the resist film after development, which can then serve as an etch-resistant mask for subsequent pattern transfer steps. The resolution obtained is dependent on quality of aerial image and ability of resist to maintain that image.

CARs have been developed for 248, 193, and 157 nm lithography. The resolution, R, of an optical projection system such as a lithography stepper is limited by parameters described in Raleigh's equation:

$$R = k\lambda/NA,$$

where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The theoretical dimensional limit of equal-sized half-pitch features is one quarter of the wavelength, $\lambda$. (k = 0.25) when NA = 1, as the dose applied to the resist is equal to the square of the intensity, and thus the resolution cannot be modulated by any more than $\lambda/4$, or a pitch of $\lambda/2$. The resolution attainable with each advancing generation of materials has been extended toward these limits through the use of low k techniques and high numerical aperture tools. For 157 nm lithography, the latest VUV wavelength being developed for manufacturing, and using a very high but potentially manufacturable NA of 0.95, the minimum k factor (i.e. $\lambda/4$) equals ~40 nm. To obtain images below this feature size, either an extension of NA to >1, such as is afforded with immersion lithography, or with a non-diffraction limited, non-optical lithography system, such as the so-called next generation lithography (NGL), are options. The most promising of these NGLs are extreme ultraviolet (EUV, sometimes referred to as soft x-ray) or electron beam lithography (EBL).

As the desired feature size decreases, the resolution capability of many current resists is not sufficient to yield the smaller features. The need to achieve less than 100 nm resolution has prompted a push toward increasing numerical aperture (NA) exposure tools. The higher NA allows for improved resolution of smaller feature sizes, however, the higher NA also reduces the depth of focus of aerial images projected onto the resist film. Since the depth of focus is more shallow, the thickness of the resist film becomes a factor in properly exposing the resist. Thus, thinner resist films may be required for proper exposure at high resolution, but such films often do not yield acceptable overall performance, especially when considering etch requirements for the underlying substrate.

As the resist film is thinned to account for the higher NA, the resist becomes less suitable as an etch mask against later processing of the underlying semiconductor substrate. For example, since the resist film is thin, variation in thickness becomes more significant and may introduce defects into subsequent devices formed on the substrate. Also, micro-channels often form in the upper portions of a resist layer during transfer of the resist image to the substrate by etching. When the resist layer is thin, the micro-channels may extend to the underlying substrate rendering the resist less effective as a mask.

In addition, the process latitude of many current resists is not sufficient to consistently produce the smaller desired features within specified tolerances. Some of the process parameters where variance may be difficult to avoid include bake time and temperature, exposure time and source output, aerial image focus, and develop time and temperature. The process latitude of a resist is an indication of how wide such variations can be without resulting in a change in the resolution and/or image profile (i.e., size and/or shape of a resist image). That is, if the process latitude is sufficiently wide, then a process parameter may vary, but the variance will not produce a change in the resist image incompatible with specified tolerances.

One approach that enables the use of higher NA exposure tools as well as a thinner resist film is multilayer resist processing. One type of multilayer resist processing uses a bilayer (two layer) imaging scheme by first casting a highly energy absorbing underlayer on the semiconductor substrate then casting a thin, silicon-containing imaging layer (resist film) on top of the underlayer. The silicon-containing resist provides good etch selectivity for anisotropic dry etch processing, such as reactive ion etch (RIE) using an oxygen-containing plasma. Next, selected portions of the silicon-containing layer are exposed and developed to remove the unexposed portions of a negative resist film or the exposed portions of a positive resist film. Generally, the underlayer is highly absorbing at the imaging wavelength and is compatible with the imaging layer. Interactions to be considered include adhesion between the two layers, intermixing, and contamination of the imaging layer by the components of the underlayer. Also, the refractive index of the underlayer is matched to the refractive index of the silicon-containing resist layer to avoid degrading the resolution capability of the silicon-containing resist.

Conventional underlayers include diazonapthoquinone (DNQ)/novolac resist material or novolac resin cast on the semiconductor substrate. The underlayers are typically selected to have good selectivity for an anisotropic etch, and to be sufficiently rigid to minimize feature collapse.

For the imaging layer, resists containing a wide variety of silicon-containing polymers have been used, including silsesquioxane, silicon-containing acrylics, silanes, etc. Among the several possible silicon-containing polymers, aqueous base-soluble silsesquioxane polymers, such as poly (p-hydroxybenzylsilsesquioxane) (PHBS), have emerged as the most promising candidates for silicon-containing polymers in bilayer resist systems. Unfortunately, although it is promising, PHBS suffers from several shortcomings.

A phenomenon known as image blur diminishes the integrity of the pattern (Hinsberg et al., *Proc. SPIE*, 2000, 3999, 148 and Houle et al., *J. Vac. Sci. Technol B*, 2000, 18, 1874). Image blur can be defined as the deviation of the developable image from that of projected aerial image which is transferred into the film as the concentration of photochemically generated acid. While accelerating the rate of the deprotection reaction, the application of thermal energy diminishes the fidelity of the aerial image of acid formed during the patternwise exposure. Image blur can be divided into two contributing factors: gradient-driven acid diffusion and reaction propagation. Both factors contribute to blur, but to different degrees and with different temperature dependence.

The first factor contributing to image blur is often referred to as acid diffusion and can be described by Fickian diffusion models for solids (Hinsberg, 2000). Choice of the photoacid being generated from the photoacid generator (PAG) and the mobility in the chosen polymer matrix dictate this factor. The mobility in the polymer matrix is dependent on the comprising chemical functionality of the polymer, the free volume of the matrix, the glass transition temperature ($T_g$) of the polymer and the temperature and time of baking steps encountered during the resist processing. Processing at temperatures above $T_g$ will tend to increase image blur.

A second contributing factor to image blur is sometimes described as reaction propagation (Hinsberg, 2000; Houle, 2000) and is best described by Arhenius behavior. Activation energy (enthalpy, hereinafter referred to as $E_a$), volatility of products (entropy), and the availability and concentration of deprotection-reaction-dependent co-reactants such as moisture dictate the degree to which the reaction propagates away from the original acid profile. Higher $E_a$ for the deprotection reaction requires higher baking temperatures, which will tend to increase image blur. Current resists for 193 nm lithography have relatively high $E_a$ (i.e. greater than about 20 kcal/mol).

In order to achieve high resolution, high sensitivity and high degree of process latitude, both image blur factors must be eliminated or minimized. Both of these contributing factors can be tempered by the addition of acid-quenchers, or bases, which have been shown to reduce image blur. Additionally it has been recognized that image blur is temperature dependent, and tends to increase as processing temperature increases. Breyta et al. disclose that appropriate baking conditions can optimize the resolution attainable with CARs in U.S. Pat. No. 6,227,546. However, since the extent of thermally induced image blur has been estimated to be on the order of 10–50 nm with conventional resist processing schemes by various researchers (Hinsberg 2000; Houle 2000; Krasnaperova et al., *J. Vac. Sci. Technol. B*, 1994, 12, 3900; Lin et al, *Science* 2002, 297, 372), processing that reduces this phenomenon further are desirable.

A higher $T_g$ is often desired to avoid blur-inducing film instability. Higher $T_g$ is typically achieved by providing longer cyclic chains in the side groups. For example, to increase $T_g$, bulky groups, such as alicyclic structures, are used in the side chain. Unfortunately, these bulky groups tend to decrease the transparency of the resist formulation at the wavelengths of interest. The addition of fluorine in the polymer structures can improve transparency, but in some instances the addition of fluorine may not be enough to achieve sufficient transparency and the other desired resist properties and performance.

Thus, there is a need for improved silsesquioxane polymers structures useful in resist compositions and in photolithography processes, that have improved transparency at wavelengths at or below 193 nm with minimized image blurring.

SUMMARY OF INVENTION

The invention provides improved silsesquioxane polymers structures useful in resist compositions, resist compositions that have improved transparency at wavelengths at or below 193 nm with minimized image blurring, and photolithographic processes using such resist compositions.

The silsequioxane polymers of the invention are preferably characterized by (a) the presence of pendant solubility inhibiting acid-labile moieties that have low activation energy for the acid-catalyzed cleaving or deprotection reaction and (b) the minimization or avoidance of high optical density moieties.

It is yet another objective of the present invention to provide a photolithographic method of forming a structure on a substrate that is effective at wavelengths at or below 193 nm to provide high resolution transfer of patterned images.

The present invention provides silsesquioxane polymers that are useful in resist compositions, and more particularly in positive resist compositions, and photolithographic imaging methods for using such resist compositions. The inventive lithographic imaging methods are particularly useful in the manufacture of integrated circuits or other similarly patterned structures of very high resolution, patterned structures.

Accordingly, the present invention provides a resist composition that includes an acid-sensitive imaging polymer and a radiation-sensitive acid generator, wherein the imaging polymer contains a silsesquioxane backbone and a solubility inhibiting pendant acid-labile moiety having a low activation energy for acid-catalyzed cleaving, and wherein at least a portion of the imaging polymer is fluorinated and the presence of high optical density moieties is minimized or avoided.

In another aspect of the present invention, the imaging polymer in the inventive resist composition also includes a pendant solubility promoting moiety, The present invention is directed to a method of forming a structure on a substrate, including the steps:

(a) providing a substrate;
(b) applying a resist composition to the substrate to form a resist layer on the substrate, wherein the resist composition includes (i) an acid-sensitive imaging polymer, and (ii) a radiation-sensitive acid generator, wherein the imaging polymer contains a silsesquioxane backbone, and a solubility inhibiting pendant acid-labile moiety having a low activation energy for acid-catalyzed cleaving and wherein at least a portion of the imaging polymer is fluorinated and the presence of high optical density moieties are minimized or avoided;

(c) patternwise exposing the substrate to radiation, whereby acid is generated by the radiation-sensitive acid generator in exposed regions of the resist layer;

(d) removing patternwise soluble portions of the resist layer to form a pattern of spaces in the resist layer; and (e) transferring the pattern of spaces to the substrate.

Optionally, the method may also include baking the exposed resist layer to promote an acid-catalyzed reaction in exposed portions of the resist layer subsequent to exposure (post-exposure bake or PEB).

In yet another aspect of the present invention, the lithographic method is a multilayer method, wherein a planarizing layer is formed over the material layer, and the resist layer is applied directly to the planarizing layer.

According to another aspect of the invention, the step of transferring the pattern to the material layer may include any of depositing, implanting or etching the substrate through the pattern of spaces.

The foregoing and other features and advantages of the invention will be apparent from the following detailed description of the invention.

DETAILED DESCRIPTION OF THE INVENTION

The invention provides new silsesquioxane polymers useful in resist or resist compositions, and is particularly useful in positive resist compositions. The invention also encompasses resist compositions containing silsesquioxane polymers mentioned above as well as methods of using such resist compositions in forming a patterned material structure on a substrate.

The resist compositions of the invention are characterized in part by the presence of a silsesquioxane polymeric component, where:

(i) at least a portion of the polymeric component contains fluorinated moieties, (ii) at least a portion of the polymeric component contains pendant acid labile moieties which inhibit solubility of the resist in aqueous alkaline solutions, in which the acid labile moieties have low activation energy for the acid-catalyzed cleaving reaction and the presence of high optical density moieties are minimized or avoided, and (iii) at least a portion of the polymeric component contains pendant polar moieties which promote alkaline solubility of the resist in aqueous alkaline solutions.

The silsesquioxane polymeric may have SiO moieties present as part of a polymer backbone or in groups which are pendant from the polymer backbone. Preferably, the SiO moieties form part of a silsesquioxane polymer backbone or matrix structure. The silsesquioxane polymeric components preferably contain monomers of the structure:

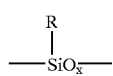

(I)

where x is about 1.5, and R is a group (i) at least a portion of which is fluorinated to increase transparency, and contains (ii) a polar moiety which promotes alkaline solubility of the resist in aqueous alkaline solutions, and (iii) an acid labile moiety which inhibits solubility of the resist in aqueous alkaline solutions. Preferably, the presence of high optical density moieties are minimized or avoided.

Preferred solubility promoting polar moieties preferably include a hydroxyl or carboxylic acid moiety, more preferably a hydroxyl moiety. Solubility promoting moieties in R may include sulfonamide, dicarboxyimide, N-hydroxy dicarboxyimide, any other amino group or any imino group. R may also include fluorinated versions of such solubility promoting moieties.

Solubility inhibiting acid labile moieties are preferably pendant from the backbone or matrix polymer and/or are provided in the polymer matrix as separate dissolution inhibitor molecules containing acid labile moieties. The acid labile moieties are preferably cleavable in the presence of acid at a temperature at which image blur is minimized or avoided. In a preferred embodiment, the acid labile moieties are cleavable in the presence of acid at room temperature. Preferred acid labile moieties are those classified as low activation energy ($E_a$) protecting groups (i.e. where $E_a$ is less than about 20 kcal/mol).

The acid labile moieties are preferably low activation energy groups, preferably acetals, ketals or orthoesters. Examples of preferred ketal protecting groups include, but are not limited to, methoxy propyl, methoxy cyclohexyl and benzyloxy propyl and derivatives and analogs thereof. Other preferred ketal moieties are described in U.S. Pat. 5,712,078 and EP Published Application EP0628876A1, the disclosures of which are incorporated herein by reference.

The silsesquioxane polymer preferably contains a combination of such monomers (I) having different R groups selected from (a)–(b). Thus, the silsesquioxane polymer of the present invention preferably contains one or more monomers selected from the group consisting of:

where $R^1$ contains a polar moiety that promotes alkaline solubility of the resist in aqueous alkaline solutions, and $R^2$ contains an acid labile moiety that inhibits solubility of the resist in aqueous alkaline solutions. The silsesquioxane polymer preferably contains a combination of monomers (a) and (b). Preferably at least a portion of the silsesquioxane polymer is fluorinated, which may include at least a fluorinated portion of monomers (a) and/or (b).

The novel silsesquioxane polymers of the invention preferably includes a combination of monomeric units (II) and (III) described by the formulas:

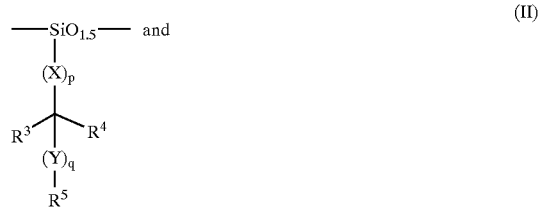

-continued (III)

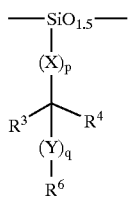

in which:

each $R^3$ is independently selected from any of a hydrogen atom, a fluorine atom, a linear or branched alkyl, a fluorinated linear or branched alkyl, a fluorocycloalkyl, a fluoroaryl, or any combination thereof, and $R^3$ may optionally further include any of oxygen, sulfur or nitrogen;

each X is independently selected from any one of an oxygen atom, a sulfur atom, $NR^3$, a linear or branched alkyl, a linear or a branched fluoroalkyl, a fluorocycloalkyl, a fluoroaryl, wherein p is an integer having the value 1 or 0 (i.e. including a single bond between a silicon atom of the silsesquioxane group and a carbon atom of a side group);

each Y is independently selected from any one of a linear or branched alkyl, a linear or branched fluoroalkyl, a fluorocycloalkyl, a fluoroaryl, wherein q is an integer having the value 1 or 0 (i.e. $R^3$, $R^4$, $R^5$ bonded to the same carbon atom);

each $R^4$ is independently selected from any of fluorine, linear or branched fluoroalkyl, fluorocycloalkyl, fluoroaryl, or any combination thereof, and $R^4$ may optionally further include any of oxygen, sulfur or nitrogen, or any combination thereof; and $R^5$ represents an independently selected solubility inhibiting group, and $R^6$ represents an independently selected solubility promoting group. The solubility promoting group is preferably a hydroxyl or carboxylic acid moiety, more preferably a hydroxyl moiety, such as a fluoroalcohol. The solubility promoting group may also be an imino group or an amino group, including, but not limited to sulfonamide, dicarboxyimide, N-hydroxy dicarboxyimide phenol, or fluorinated versions thereof. A solubility inhibiting group may contain any suitable acid labile moiety which can be formed as a part of a pendant group from the silsesquioxane structure. Preferably, the acid labile moiety is an acetal, a ketal or orthoester, or fluorinated versions thereof.

The novel silsesquioxane polymers of the invention may also preferably contain a combination of monomeric units (III) and (IV) or units (II) and (V), where the units (IV) and (V) are described by the formulas:

(IV)

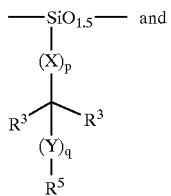 and (V)

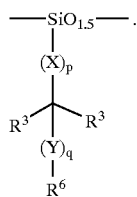

The novel FSQ polymers of the invention preferably have a weight average molecular weight of about 800 to 500,000, more preferably about 1,500 to 100,000, and most preferably about 1,500 to 10,000.

The properties of interest in this regard include solubility in aqueous alkaline developers and a glass transition temperature ($T_g$) that is compatible with normal thermal processing, such as post-apply bake (PAB) and post-exposure bake (PEB). The $T_g$ is preferably between 30 and 400° C., more preferably between 30 and 250° C., and most preferably between 30 and 150° C. These properties are discussed further below in the discussion of resist compositions.

The photosensitive acid generators (PAGs) used in the resist compositions of the invention may be any suitable photosensitive acid generator known in the resist art, which is otherwise compatible with the other selected components of the resist composition, and in particular, for positive resist compositions. Examples of preferred photosensitive acid generators (PAG) include: (trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide ("DDSN") may be used. Fluorinated PAG is also preferred for better transparency at 157 nm. Another example of a preferred PAG includes a PAG containing a structure having the formula

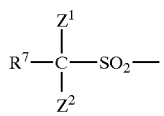

where $R^7$ is a monovalent organic group with a fluorine content of 50 wt % or less, a nitro group, a cyano group, or a hydrogen atom, and $Z^1$ and $Z^2$ are individually a fluorine atom or a linear or branched perfluoroalkyl group having 1–10 carbon atoms, as described in U.S. Published Patent Application No. US 2003/0113658 A1, published Jun. 19, 2003, the disclosure of which is incorporated by reference. Combinations of PAGs may be used.

In addition to the above components, the resist compositions of the invention generally include a casting solvent to dissolve the other components so that the overall composition may be applied evenly on the substrate surface to provide a defect-free coating. Where the resist composition is used in a multilayer imaging process, the solvent used in the imaging layer resist is preferably not a solvent to the underlayer materials, otherwise the unwanted intermixing may occur. When the underlayer composition uses a crosslinker approach, a cross-linked underlayer will prevent intermixing. In this case, the same or a different solvent can be used for both the imaging layer and the underlayer.

Examples of suitable casting solvents include: ethoxyethylpropionate ("EEP"), a combination of EEP and γ-butyrolactone ("GBL"), propylene-glycohnonoethylether acetate (PGMEA), and ethyl lactate. The invention is not limited to selection of any particular solvent.

The resist compositions may further include organic base additives, surfactants, sensitizers or other expedients known in the art. The compositions of the present invention are not limited to any specific selection of these expedients.

Examples of base additives include: dimethylamino pyridine, 7-diethylamino-4-methyl coumarin ("Coumarin 1"), tertiary amines, imidazoles, imides, amides, proton sponge, berberine, and the polymeric amines as in the PLURONIC® or TETRONIC® series from BASF. Tetra alkyl ammonium hydroxides or cetyltrimethyl ammonium hydroxide may be used as a base additive when the PAG is an onium salt.

Examples of possible surfactants include fluorine-containing surfactants such as the FLUORAD™ series, preferably FC-430, and more preferably, FC-4430, both available from 3M Company in St. Paul, Minn., and siloxane-containing surfactants such as the SILWET® series available from Union Carbide Corporation in Danbury, Conn.

The resist compositions of the invention are not limited to any specific proportions of the various components. The resist composition of the present invention preferably includes about 0.1–25 wt. % PAG, more preferably about 0.5–15 wt. %, based on the total weight of imaging polymer in the composition. The inventive resist composition preferably contains about 0.02–8 wt. % of the base additive, more preferably about 0.1–2 wt. %, based on the total weight of acid sensitive polymer. Where the resist compositions of the invention contain a solvent, the overall composition preferably contains about 50–98 wt. % solvent.

The resist compositions of the invention are useful in single layer photolithographic processes, and are especially useful as imaging layers in multilayer photolithographic processes, such as bi-layer or tri-layer processes. Preferably, the resist compositions of the invention may be patterned using various radiation types such as 365 nm wavelength, deep-UV (specifically 248 nm, 193 nm, and 157 nm wavelengths), extreme-UV (approximately 13 nm wavelength), x-ray, electron beam, and ion beam. The appropriate radiation type(s) may depend on the components of the overall resist composition (e.g., the selection of the polymer component, photosensitive acid generator (PAG), base (or quencher), surfactant, solvent, etc.). The resist compositions of the invention generally provide high resolution (approximately 100 nm resolution or less, more particularly below 70 nm) in combination with desired dissolution behavior.

The present invention encompasses a single layer method of forming a structure on a substrate, including the steps:

(a) providing a substrate;
(b) applying a resist composition to the substrate to form a resist layer on the substrate, wherein the resist composition includes (i) an acid-sensitive imaging polymer, and (ii) a radiation-sensitive acid generator, wherein the imaging polymer contains a silsesquioxane backbone, and a solubility inhibiting pendant acid-labile moiety having a low activation energy for acid-catalyzed cleaving and wherein at least a portion of the imaging polymer is fluorinated;
(c) patternwise exposing the substrate to radiation, whereby acid is generated by the radiation-sensitive acid generator in exposed regions of the resist layer; and
(d) removing patternwise soluble portions of the resist layer to form a pattern of spaces in the resist layer; and
(e) transferring the pattern of spaces to the substrate.

The exposed resist layer may be baked to promote an acid-catalyzed reaction in exposed portions of the resist layer.

The substrate may include a material layer to be patterned, and the method may further include a step of transferring the pattern of spaces in the resist layer to the underlying substrate by removing portions of the material layer through the pattern of spaces in the resist layer. Alternatively, the method may include a step of transferring the pattern of spaces in the resist layer to the underlying substrate material (which may include one or more layers of material) by depositing a material (such as an organic dielectric, a metal, a ceramic or a semiconductor) onto the substrate at the spaces in the resist layer, or by implanting dopants into the substrate material. The substrate may include any suitable material useful in the formation of microelectronic structures, and is preferably selected from any of an organic dielectric, a metal, a ceramic or a semiconductor.

The invention also encompasses a multilayer (e.g. bi-layer or tri-layer) lithography method including the steps of: a) forming a first layer of a planarizing material on a substrate; b) forming a second (imaging) layer of a resist material on the first layer, wherein the second layer includes a resist composition of the invention; c) pattern-wise exposing the second layer to radiation using a patterning tool, optionally followed by post-exposure baking (PEB); and d) developing a pattern in the second layer to remove unexposed portions of the second layer and to form a patterned resist that reveals portions of the first layer. As in a single layer method, the multilayer method may further include transferring the pattern of spaces in the resist by any conventional method such as depositing, implanting or etching.

Preferably, the first layer is a planarizing underlayer that is highly energy absorbing, and/or reduces reflection to the imaging resist layer. The planarizing underlayer is preferably applied directly over the material layer to be patterned. Subsequently, a layer of the inventive resist composition is applied over the first planarizing underlayer, using spin coating or other techniques. The resist coating is preferably as thin as possible provided that the thickness is preferably substantially uniform and that the resist layer is sufficient to withstand subsequent processing (typically reactive ion etching (RIE)) to transfer the lithographic pattern to the planarizing underlayer. Optionally, the substrate with the resist coating may be heated (pre-exposure bake or post-apply bake (PAB)) to remove the solvent and improve the coherence of the resist layer. The PAB step is preferably conducted for about 10 seconds to about 15 minutes, more preferably about 15 seconds to about two minutes. The PAB temperature may vary depending on the $T_g$ of the resist.

The resist pattern is then patternwise exposed to the desired radiation (e.g., 157 nm radiation). Where scanning particle beams, such as electron beam, are used, patternwise exposure may be achieved by scanning the beam across the substrate and selectively applying the beam in the desired pattern. More typically, wavelike radiation, such as 193 nm or 157 nm UV radiation, is projected through a mask to provide patternwise radiation exposure to the resist. Preferably, the resist image formed in the second layer is a high resolution resist image. Resolution enhancement techniques (RET), such as attenuated phase shift (attPSM), or alternating phase-shift (altPSM) masks or other RET methodologies, may be used as the radiation wavelengths decrease.

Optionally, the patternwise exposed resist layer may be baked (post-exposure bake or PEB) between the exposure and developing steps to further complete the acid-catalyzed reaction, to facilitate the deprotection of acid labile groups in the radiation-exposed portions of the resist layer and to enhance the contrast of the exposed pattern. The PEB is preferably conducted at about 10–175° C., more preferably about 20–120° C. The PEB is preferably conducted for about 30 seconds to 5 minutes.

The resist structure with the desired pattern is obtained (developed as in step (d)) by contacting the resist layer with an alkaline solution that selectively dissolves the areas of the resist which were exposed to radiation. Preferred alkaline solutions (developers) are aqueous solutions of tetramethyl ammonium hydroxide (TMAH). Preferably, the step of developing the second layer uses an aqueous solution of TMAH of about 0.14 N or greater, more preferably about 0.20 N or greater, most preferably about 0.26 N or greater. The resulting lithographic structure on the substrate is then typically dried to remove any remaining developer solvent.

The portions of the first planarizing underlayer are preferably removed (i.e. in step (e) to remove revealed portions of the first layer using remaining portions of the second layer as a mask) by etching. Preferably, the etching is performed by $O_2$ plasma reactive ion etching (RIE) or other anisotropic etching techniques. Once the desired portions of the underlayer have been removed, the pattern may be transferred to portions of the substrate, for example, by etching (e.g., by reactive ion etching) the substrate at positions corresponding to the removed portions of the underlayer. Once the desired pattern transfer has taken place, any remaining underlayer and resist may be removed by using conventional stripping techniques.

The planarizing underlayer should be sufficiently etchable, selective to the overlying resist (to yield a good profile in the etched underlayer) while being resistant to the etch process needed to pattern the underlying material layer. Additionally, the planarizing underlayer composition should have the desired optical characteristics (e.g., refractive index, optical density, etc.) such that the need for any additional antireflective coating (ARC) layer is avoided. The planarizing underlayer composition should also have physical/chemical compatibility with the imaging resist layer to avoid unwanted interactions which may cause footing and/or scumming. Preferably, the planarizing underlayer compositions are characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker, as described in U.S. Published Patent Application No. US 2002/0058204 A1, published May 16, 2002, the disclosure of which is incorporated herein by reference. Most preferably, a portion of the above-mentioned planarizing underlayer composition further comprises fluorinated polycyclic moieties and/or fluorinated aromatic moieties.

The following examples are provided to further describe the present invention.

The invention is not limited to the details of the examples.

EXAMPLE 1

Synthesis of 25% methoxycyclohexene (MOCH) protected poly(2-hydroxy-3,3,3-trifluoropropylsilsesquioxane) (FSQ-25% MOCH)

25 g of 20 wt. % poly(2-hydroxy-3,3,3-trifluoropropylsilsesquioxane) in PGMEA solution was added in with approximately 35 mg of oxalic acid. After the acid was dissolved, 1.54 g of 1-methoxycyclohexene was added to the solution, and the reaction was carried out at room temperature with stirring overnight. The reaction was then quenched with 5 g of basic active aluminum oxide. The protection level of 25% on fluorocarbinol group was determined by C13 NMR.

EXAMPLE 2

Synthesis of 40% methoxycyclohexene (MOCH) protected poly(2-hydroxy-3,3,3-trifluoropropylsilsesquioxane) (FSQ40% MOCH)

100 g of 20 wt. % poly(2-hydroxy-3,3,3-trifluoropropylsilsesquioxane) in PGMEA solution was added with approximately 60 mg of oxalic acid. After the acid was dissolved, 12.56 g of 1-methoxycyclohexene was added to the solution, and the reaction was carried out at room temperature with stirring overnight. The reaction was then quenched with 7.2 g of basic active aluminum oxide. Nitrogen was blown through the flask to substantially remove the MOCH. The protection level of 40% on the fluorocarbinol group was determined by C13 NMR.

EXAMPLE 3

Synthesis of FSQ with protecting groups ethyl vinyl ether (EVE), ethoxycyclohexene (EOCH), methoxypropene (MOP), and dihydropyrane (DHP), protected poly(2-hydroxy-3,3,3-trifluoropropylsilsesquioxane), resulting in FSQ protected polymers FSQ-EVE, FSQ-EOCH, FSQ-MOP and FSQ-THP, respectively.

The synthetic procedures for different acetal and ketal protected FSQ were carried out the same way as in EXAMPLE 1 with the quantity of materials listed in the Table 1 below. All the reactions were quenched with 1.5 g of $Al_2O_3$.

TABLE 1

| Polymer | FSQ (20% solid) | Protecting group | catalyst | NMR |
|---|---|---|---|---|
| FSQ-EVE | 10 g | 0.58 g ethyl vinyl ether | ~4.5 mg trifluoracetic acid | 44% protection |
| FSQ-EOCH | 10 g | 0.85 g ethoxycyclohexene | ~10 mg oxalic acid | 8% protection |
| FSQ-MOP | 12 g | 0.56 g methoxypropene | ~5 mg oxalic acid | 15% protection |
| FSQ-THP | 12 g | 0.70 g dihydropyrane | ~5 mg trifluoroacetic acid | — |

EXAMPLE 4

E-beam sensitivity evaluations of resists formulated with FSQ polymers protected with different protecting groups.

Resist formulations were obtained by mixing partially protected polymers (from EXAMPLE 3) with 0.4 wt. % (relative to the polymer) tetrabutyl ammonium hydroxide (TBAH) and 3 wt. % triphenylsulfonium triflate (TPS TRF) and 200–1000 ppm of FLUORAD™ FC-430 surfactant (available from 3M Company) in PGMEA solvent. The total solid weight content in the solution was about 14%. The resists were spin coated on hexamethyldisilazane (HMDS)

primed wafers. The film was baked (post-apply bake or PAB) on a hot plate at 90–110° C. for 1 minute. The exposures were performed at 25 kV on ElectronCure™-200M manufactured by Electron Vision Group. After exposure, resists were either baked at 90–1100° C. for 1 minute or rested for 30 minutes without post-exposure bake (PEB) before being developed with 0.26N TMAH for 60–75 s. The following Table 2 lists the doses to clear large square exposed with resist formulations with different acetal and ketal protected polymers.

TABLE 2

| Polymer in the resist formulation | Process conditions | Dose to clear |
|---|---|---|
| FSQ-25% MOCH | 1500 rpm, 110° C./60 s PAB and 90° C./60 s PEB, 0.26 N TMAH 60 s | 5.5 $\mu C/cm^2$ |
| FSQ-40% MOCH | 2000 rpm, 110° C./60 s PAB and NO PEB, 0.26 N TMAH 60 s | 6 $\mu C/cm^2$ |
| FSQ-EVE | 1500 rpm, 110° C./60 s PAB and 90° C./60 s PEB, 0.26 N TMAH 60 s | 6 $\mu C/cm^2$ |
| FSQ-EOCH | 1500 rpm, 110° C./60 s PAB and NO PEB, 0.26 N TMAH 60 s | 6 $\mu C/cm^2$ |
| FSQ-MOP | 1500 rpm, 90° C./60 s PAB and NO PEB, 0.26 N TMAH 75 s | 8 $\mu C/cm^2$ |
| FSQ-THP | 1500 rpm, 100° C./60 s PAB and 100° C./60 s PEB, 0.26 N TMAH 60 s | 5.5 $\mu C/cm^2$ |

EXAMPLE 5

193 nm lithographic evaluations of the resists formulated with FSQ-MOCH's

The resist formulation with FSQ-25% MOCH in EXAMPLE 4 was spin coated with 3300 rpm on AR40 (an ARC available from Shipley Company) coated wafers. The film was baked on a hot plate at 110° C. for 1 minute. The exposures were performed on an ASML PAS 5500/1100 tool with an NA of 0.75 using an attenuated phase shift mask (attPSM). After exposure, the resist was baked at 90° C. for 1 minute before being developed with 0.263 N TMAH for 60 s. 105 nm line/space (l/s) images were resolved at 8.5 mJ/cm². This resist formulation has a refractive index (n) value of 1.52 and an extinction coefficient (k) value of 0.030 in comparison to one regular polyacrylate commercial 193 nm single layer resist which has a refractive index of 1.70 and an extinction coefficient of 0.034 measured with a VASE® Ellipsometer (available from J. A. Woollam Co. Inc.). Another formulation was obtained by mixing FSQ-25% MOCH with 0.56 wt. % (relative to the polymer) tetrabutyl ammonium hydroxide (TBAH) and 6.5 wt. % di(t-butyl)phenyl iodonium perfluorobutane sulfonate and 200–1000 ppm of FC-430 surfactant (available from 3M Company) in PGMEA solvent. The total solid weight content in the solution was about 14%. The exposures were performed on an ASML PAS 5500/1100 tool with an NA of 0.75 using an attPSM mask. After exposure, the resist was baked at 90° C. for 1 minute before being developed with 0.263 N TMAH for 60 s. 105 nm l/s images were resolved at. 29 mJ/cm². Resist formulation with FSQ-40% MOCH in EXAMPLE 4 was spin coated with 3000 rpm on AR40 (from Shipley Company) ARC coated wafers. The film was baked on a hot plate at 100° C. for 1 minute. The exposures were performed on an ASML PAS 5500/1100 tool with an NA of 0.75 using an attPSM mask. After exposure, the resist was baked at 90° C. for 1 minute before being developed with 0.263 N TMAH for 60 s. Images of 80 nm lines with 180 nm pitch were resolved at 11 mJ/cm².

EXAMPLE 6

E-beam lithographic evaluations of the resists formulated with FSQ-MOCH's

Resist formulation with FSQ-25% MOCH in EXAMPLE 4 was spin coated with 4500 rpm on HMDS primed wafers. The film was baked on a hot plate at 100° C. for 1 minute. The exposures were performed on a 100 kV Leica exposure system. After exposure, the resist was allowed to sit in the regular lab environment for 30 minutes without PEB before being developed with 0.263 N TMAH for 60 s. High resolution of 50 nm l/s images was obtained at 20 $\mu C/cm^2$ with resist lines standing, and 40 nm l/s images were resolved with lines collapsed. Resist formulation with FSQ40% MOCH in EXAMPLE 3 was diluted with PGMEA to form 9% solid resist and then was spin coated with 3000 rpm on HMDS primed wafers. The film was baked on a hot plate at 100° C. for 1 minute. The exposures were performed on a 100 kV Leica exposure system. After exposure, the resist was allowed to sit in the regular lab environment for 30 minutes without PER before being developed with 0.263 N TMAH for 60 s. High resolution of 30 nm l/s images was obtained at 32 $\mu C/cm^2$ with some trace residues between lines.

EXAMPLE 7

193 nm lithographic evaluations of the resist formulated with FSQ-EVE

Resist formulation with FSQ-EVE in EXAMPLE 4 was spin coated with 3800 rpm on AR40 ARC coated wafers. The film was baked on a hot plate at 110° C. for 1 minute. The exposures were performed on an ASML PAS 5500/1100 tool with an NA of 0.75 using an attPSM mask. After exposure, the resist was baked at 90° C. for 1 minute before being developed with 0.263 N TMAH for 60 s. 105 nm l/s images were resolved at 11 mJ/cm²

EXAMPLE 8

157 nm lithographic evaluations of the resists formulated with FSQ-MOCH's

Resist formulation with FSQ-25% MOCH in EXAMPLE 4 was spin coated on DUV30J (available from Brewer Science, Inc.) ARC coated wafers to provide a resist thickness around 150 nm. The film was baked on a hot plate at 100° C. for 1 minute. The exposures were performed on a 153 nm stepper available from Exitech, Inc., with 0.85 NA and 0.3 sigma using an alternating phase shift mask (altPSM). After exposure, the resist was baked at 50° C. for 1 minute before being developed with 0.263 N TMAH for 60 s. 60 nm l/s images were resolved at 86 mJ/cm². Resist formulation with FSQ-25% MOCH in EXAMPLE 3 was spin coated on DUV30J ARC coated wafers to provide a resist thickness around 150 nm. The film was baked on a hot plate at 100° C. for 1 minute. The exposures were performed on a 153 nm stepper from Exitech, Inc., with 0.85 NA and 0.3 sigma using an altPSM. After exposure, the resist was baked at 50° C. for 1 minute before being developed with 0.263 N TMAH for 60 s. 55 nm l/s images were resolved at 106 mJ/cm².

EXAMPLE 9

Comparison of low activation energy to high activation energy formulation

Low activation energy formulation (Low $E_a$ resist): Resist formulation of FSQ-40% MOCH as in EXAMPLE 4.

High activation energy formulation (High $E_a$ resist): Resist formulation was obtained by mixing poly[2-hydroxy-3,3,3-trifluoropropylsilsesquioxane-co-5-(2-t-butoxycarbony)norbonylsilsesquioxane] with 0.5 wt. % (relative to the polymer) triphenyl imidazole and 5 wt. % di(t-butyl) phenyl iodonium perfluorobutane sulfonate and 3.9% (perfluorobutanesulfonyloxy)-bicyclo[2,2,1]hepto-5-ene-2,3-dicarboximide and 200–1000 ppm of FC430 surfactant in PGMEA solvent. The total solid weight content in the solution was about 11%.

The low activation resist was processed as in EXAMPLEs 5 and 8, while the high activation resist was baked with 130° C./60 s PAB and 110° C./60 s PEB. Comparisons were done with the same exposure tools using a phase shift mask (PSM) for 193 nm and a chrome-on-glass (COG) mask for 157 nm, and the results are listed in Table 3.

TABLE 3

| Resist | 193 nm dose latitude (105 nm l/s) | 157 nm resolution (using COG mask) | Absorbance at 157 nm |
|---|---|---|---|
| Low Ea resist | 11% | 80 nm | 1.27/μm |
| High Ea resist | 5–8% | 90 nm | 2.1/μm |

While the invention has been particularly shown and described with reference to preferred embodiments thereof, it will be understood by those skilled in the art that various changes in form and details may be made therein without departing from the spirit and scope of the invention.

What is claimed is:

1. A resist composition said composition comprising:

an acid-sensitive imaging polymer; and a radiation-sensitive acid generator, wherein said imaging polymer comprises a silsesquioxane backbone and a solubility inhibiting pendant acid-labile moiety having a low activation energy less than about 20 kcal/mol for acid catalyzed cleaving, wherein said acid-labile moiety is cleavable at room temperature and wherein at least a portion of said imaging polymer is fluorinated resist, and wherein said imaging polymer comprises a combination of monomeric units (II) and (III), (III) and (IV) or units (II) and (V), wherein the monomeric units (II) and (III) are described by the formulas:

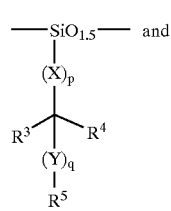
(II)

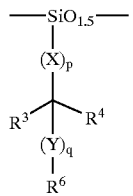
(III)

in which
each $R^3$ is independently selected from the group consisting of a hydrogen atom, a halogen atom, a linear alkyl, a branched alkyl, a fluorinated linear alkyl, a fluorinated branched alkyl, a fluorocycloalkyl, a fluoroaryl, or any combination thereof, each X is independently selected from the group consisting of an oxygen atom, a sulfur atom, $NR^3$, a linear alkyl, a branched alkyl, a fluorinated linear alkyl, a fluorinated branched alkyl, a fluorocycloalkyl, or a fluoroaryl, wherein p is an integer having the value 1 or 0, each Y is independently selected from the group consisting of a linear alkyl, a branched alkyl, a fluorinated linear alkyl, a fluorinated branched alkyl, a fluorocycloalkyl, or a fluoroaryl, wherein q is an integer having the value 1 or 0, each $R^4$ is independently selected from the group consisting of a fluorine atom, a fluorinated linear alkyl, fluorinated branched alkyl, a fluorocycloalkyl, a fluoroaryl, or any combination thereof, each $R^5$ is independently a solubility inhibiting group, and each $R^6$ is independently a solubility promoting group; and the monomeric units (IV) and (V) are described by the formulas:

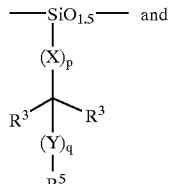
(IV)

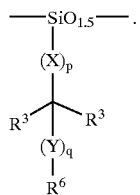
(V)

2. The resist composition of claim 1, wherein said imaging polymer further comprises a pendant solubility promoting moiety.

3. The resist composition of claim 2, wherein said pendant solubility promoting moiety is selected from the group consisting of a hydroxyl, a fluoroalcohol, a carboxylic acid, an amino group, an imino group, a fluorinated imino group and a fluorinated amino group.

4. The resist composition of claim 1, wherein said solubility inhibiting pendant acid-labile moiety is selected from the group consisting of an acetal, ketal, an orthoester and fluorinated versions thereof.

5. The resist composition of claim 1, wherein at least a portion of said solubility inhibiting pendant acid-labile moiety is fluorinated.

6. The resist composition of claim 2, wherein at least a portion of said solubility promoting moiety is fluorinated.

7. The resist composition of claim 1, wherein said silsesquioxane polymer has a weight average molecular weight of about 800 to 500,000.

8. A method of forming a structure on a substrate, said method comprising:

(a) providing a substrate;

(b) applying the resist composition of claim 1 to said substrate to form a resist layer on said substrate resist;

(c) patternwise exposing said substrate to radiation, whereby acid is generated by said radiation-sensitive acid generator in exposed regions of said resist layer, (d) removing patternwise soluble portions of said resist layer to form a pattern of spaces in said resist layer; and (e) transferring said pattern of spaces to said substrate.

9. The method of claim 8, further comprising the step of baking the exposed resist layer to promote acid-catalyzed reaction in exposed portions of said resist layer subsequent to said step (c) of patternwise exposing.

10. The method of claim 8, wherein said polymer further comprises a pendant solubility promoting moiety.

11. The method of claim 10, wherein said pendant solubility promoting moiety is selected from the group consisting of a hydroxyl, a fluoroalcohol, a carboxylic acid, an amino group, an imino group, a fluorinated imino group and a fluorinated amino group.

12. The method of claim 8, wherein said solubility inhibiting pendant acid-labile moiety is selected from the group consisting of an acetal, a ketal, an orthoester and fluorinated versions thereof.

13. The method of claim 8, wherein said solubility inhibiting pendant acid-labile moiety is selected from the group consisting of an acetal, a ketal, an orthoester and fluorinated versions thereof.

14. The method of claim 8, wherein at least a portion of said solubility inhibiting pendant acid-labile moiety is fluorinated.

15. The method of claim 10, wherein at least a portion of said solubility promoting moiety is fluorinated.

16. The method of claim 8, wherein said silsesquioxane polymer has a weight average molecular weight of about 800 to 500,000.

17. The method of claim 8, further comprising forming a planarizing layer over said substrate, and wherein said resist layer is applied directly to said planarizing layer.

18. The method of claim 17, wherein said planarizing layer has a underlayer composition comprising:

(A) a polymer containing (i) cyclic ether moieties, (ii) saturated polycyclic moieties, and (iii) aromatic moieties if said underlayer composition does not require a separate crosslinker, or (B) a polymer containing (i) saturated polycyclic moieties, and (ii) aromatic moieties if said underlayer composition requires a separate crosslinker.

19. The method of claim 18, wherein said underlayer composition further comprises a fluorinated polycyclic moiety, a fluorinated aromatic moiety or a combination thereof.

20. The method of claim 8, wherein said step of transferring further comprises a method selected from the group consisting of depositing, implanting and etching.

* * * * *